United States Patent
Wang et al.

(10) Patent No.: US 8,008,702 B2
(45) Date of Patent: Aug. 30, 2011

(54) MULTI-TRANSISTOR NON-VOLATILE MEMORY ELEMENT

(75) Inventors: Shih Wei Wang, Hsin-Chu (TW); Chun Jung Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 486 days.

(21) Appl. No.: 12/034,386

(22) Filed: Feb. 20, 2008

(65) Prior Publication Data

US 2009/0207662 A1     Aug. 20, 2009

(51) Int. Cl.
*H01L 29/788* (2006.01)

(52) U.S. Cl. ..... 257/315; 257/314; 257/316; 257/E29.3; 257/E29.308

(58) Field of Classification Search .......... 257/314–316, 257/E29.3–E29.308
See application file for complete search history.

(56) References Cited

U.S. PATENT DOCUMENTS

| | | | | |
|---|---|---|---|---|
| 4,725,983 | A * | 2/1988 | Terada | 365/185.08 |
| 5,889,303 | A * | 3/1999 | Eckert et al. | 257/316 |
| 7,072,215 | B2 * | 7/2006 | Chih | 365/185.14 |
| 7,209,392 | B2 * | 4/2007 | Chen et al. | 365/185.26 |
| 2005/0185464 | A1 * | 8/2005 | Chih | 365/185.11 |
| 2007/0257299 | A1 * | 11/2007 | Chen et al. | 257/315 |

* cited by examiner

*Primary Examiner* — Anh Phung
*Assistant Examiner* — Allison P Bernstein
(74) *Attorney, Agent, or Firm* — Haynes and Boone, LLP

(57) ABSTRACT

A multi-transistor element including a substrate, a first floating gate disposed on the substrate, a second floating gate disposed on the substrate and coupled to the first floating gate, and a first active region disposed in the substrate and coupled to the first and second floating gates.

6 Claims, 14 Drawing Sheets

MULTI-TRANSISTOR NON-VOLATILE MEMORY ELEMENT

BACKGROUND

Non-volatile memory (NVM) is often used in various devices, such as computers. NVM is a type of memory storage that can retain data even while it is not powered on. NVM may be electrically addressed or mechanically addressed. Examples of electrically addressed NVM include flash memory, EPROMs, and EEPROMs. Functionality of NVM includes having information programmed into it, having information read from it, and/or having information erased from it. As the frequency of programming to, reading from, and erasing an element of the NVM increases, the rate of degradation of the element due to electron trapping and/or channel damage also increases.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Additionally, in some views various layers or elements may be left out for clarity of discussion. Furthermore, one or more layers illustrated, including those without reference numbers associated therewith, may be omitted, represent a single layer or any plurality of layers, represent contiguous or non-contiguous layers, and/or other such embodiments.

DETAILED DESCRIPTION

Figure 1:
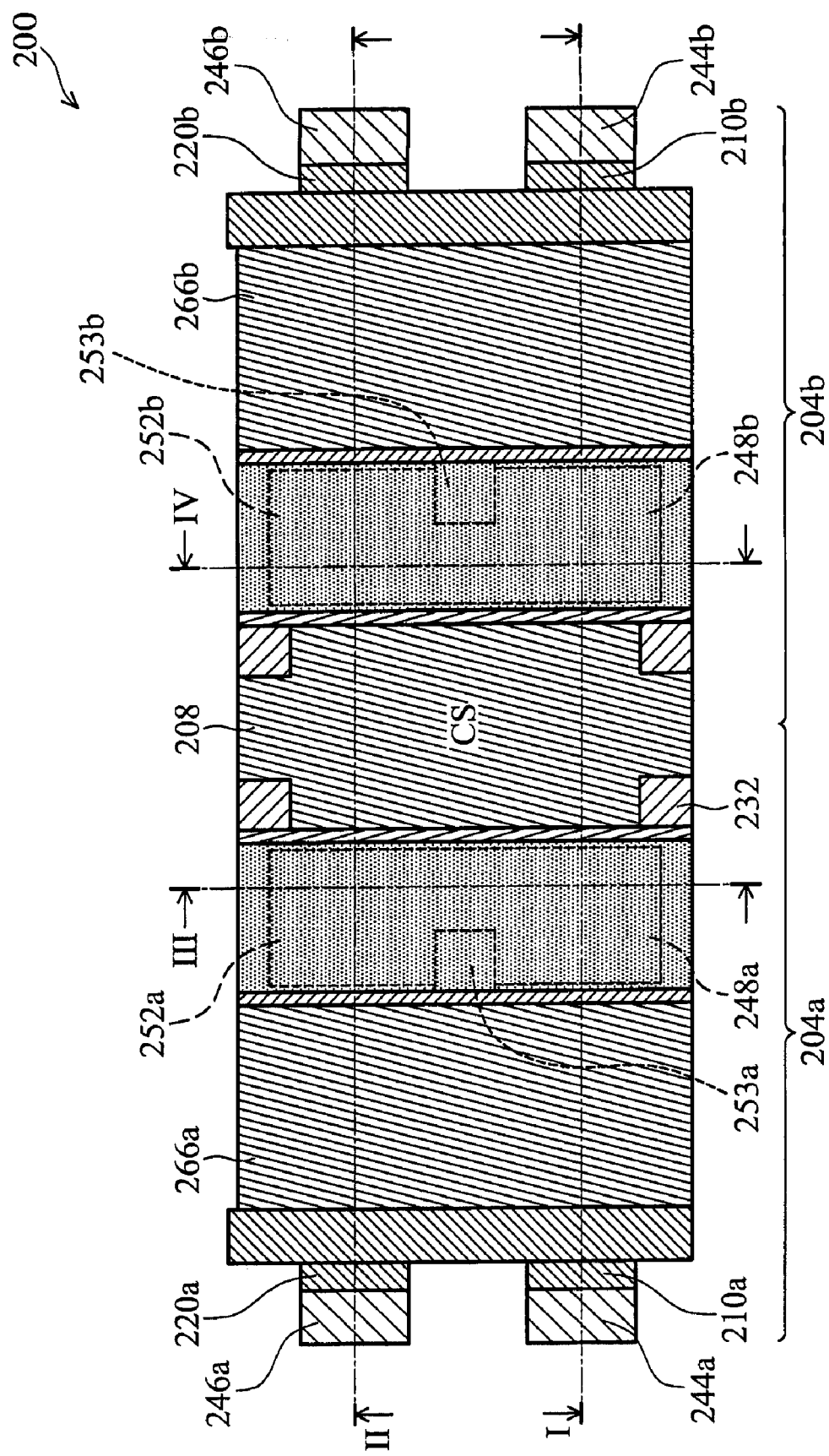
FIGS. 1-5 illustrate various views of two multi-transistor elements in accordance with one embodiment.

The present disclosure relates generally to the field of transistor elements. It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
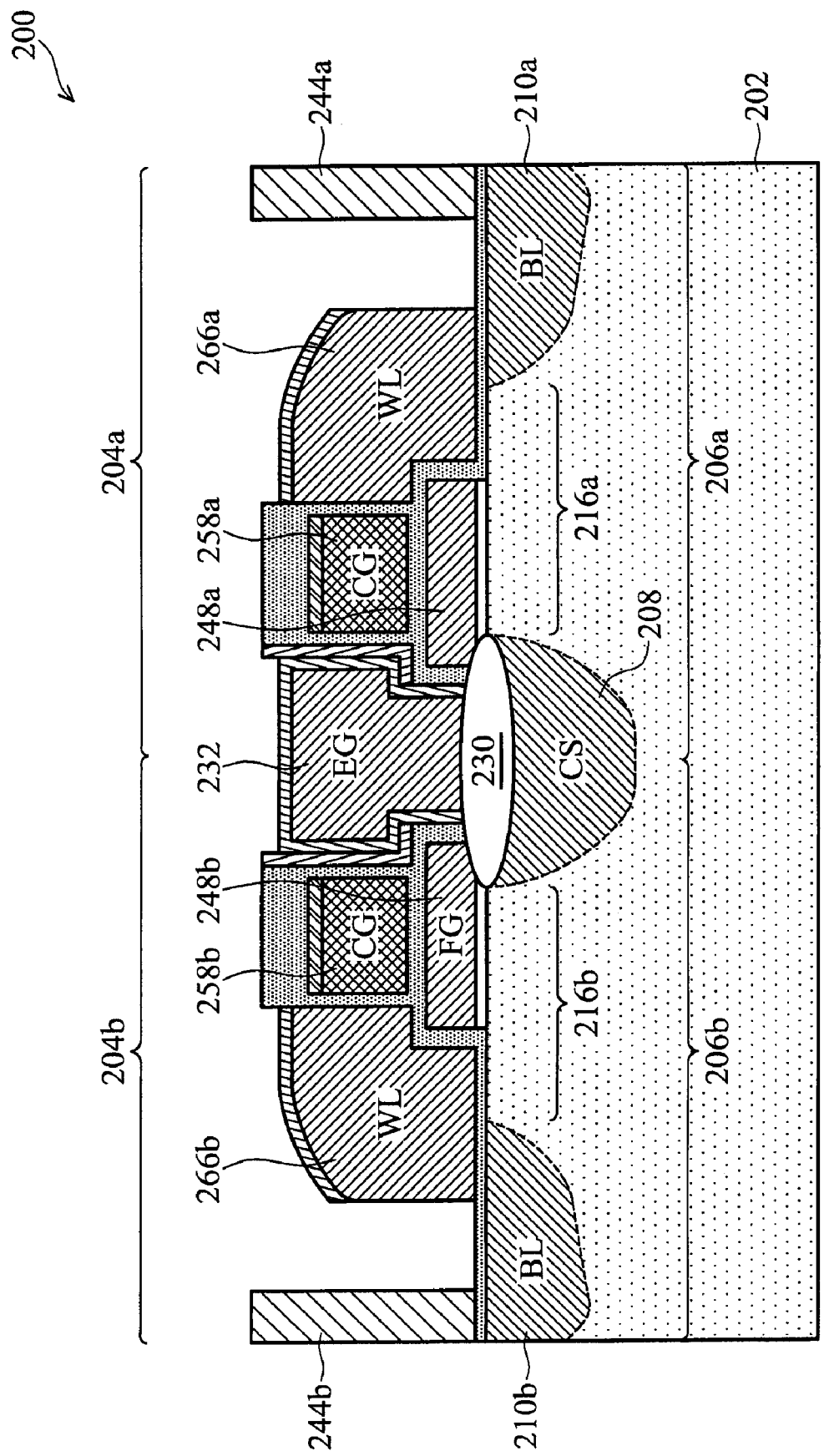
Figure 3:
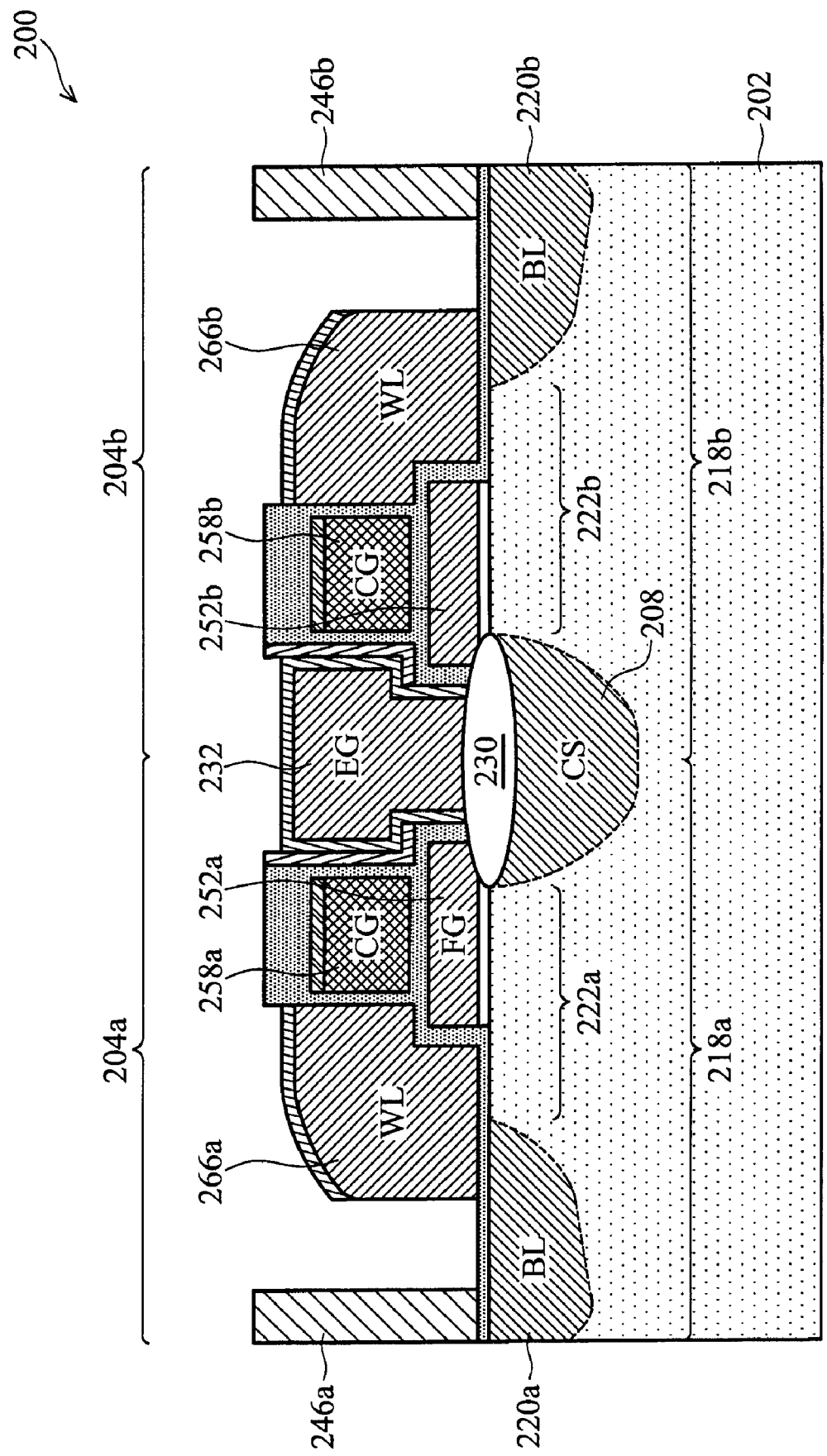
Figure 4:
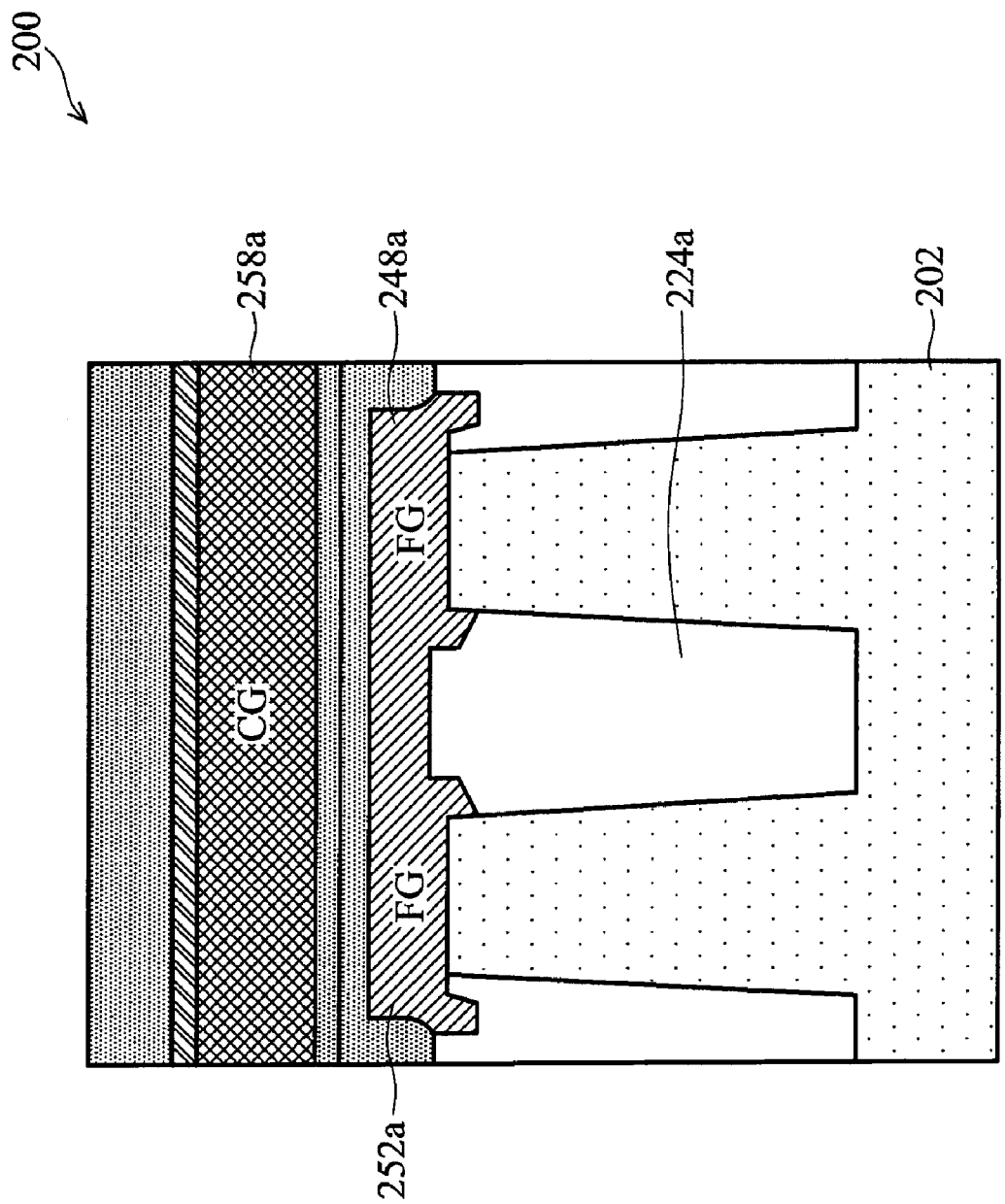
Figure 5:
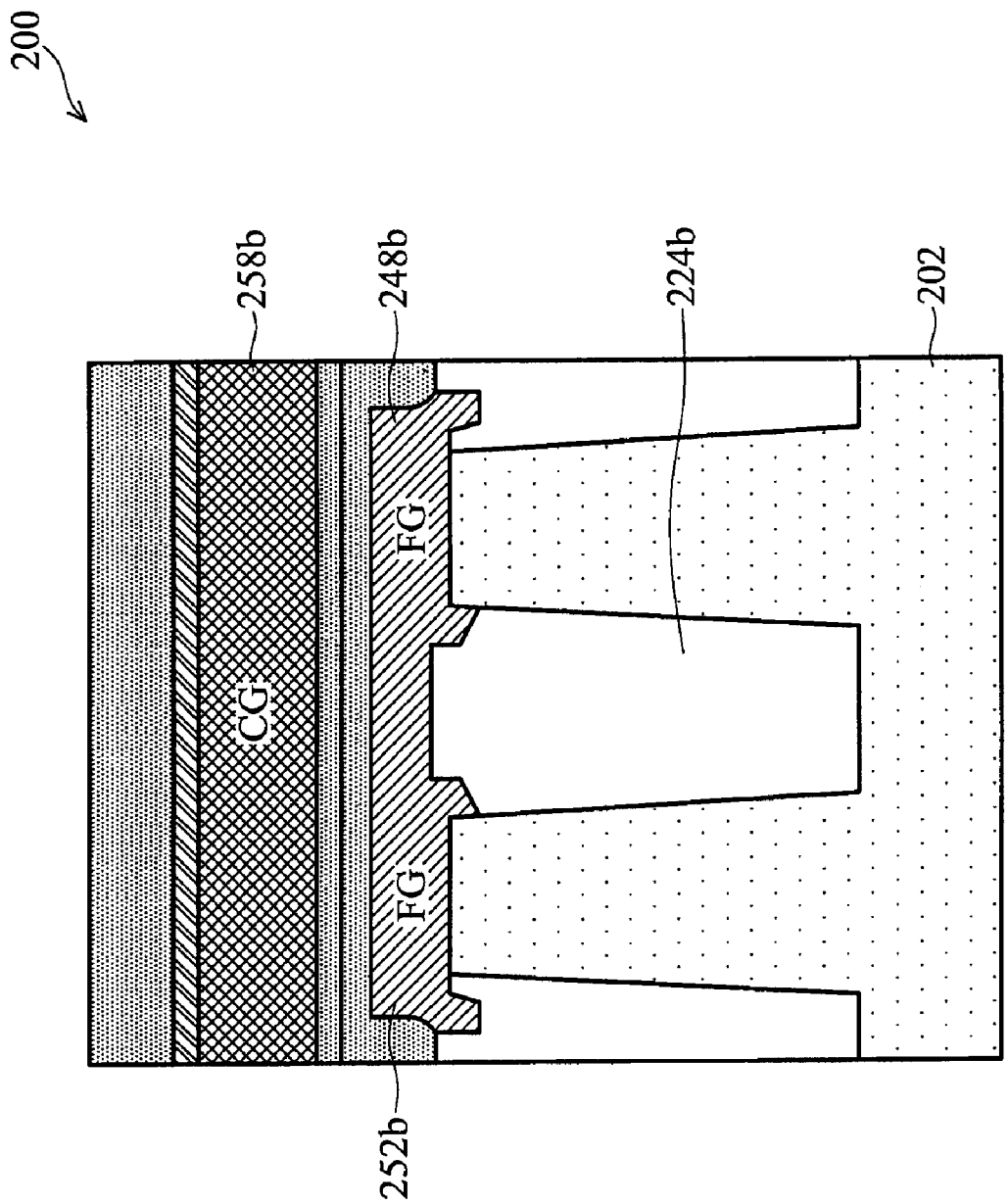

FIG. 1 provides a topographical view of two multi-transistor elements 200 in accordance with one embodiment. FIG. 2 illustrates a cross-sectional view of the two multi-transistor elements 200 of FIG. 1, taken along line I in FIG. 1. FIG. 3 illustrates a cross-sectional view of the two multi-transistor elements 200 of FIGS. 1 and 2, taken along line II in FIG. 1. FIG. 4 illustrates a cross-sectional view of the two multi-transistor elements 200 of FIGS. 1-3, taken along line III in FIG. 1. FIG. 5 illustrates a cross-sectional view of the two multi-transistor elements 200 of FIGS. 1-4, taken along line IV in FIG. 1. It is further understood that additional features can be added to the multi-transistor element, and some of the features described below can be replaced or eliminated, for additional embodiments of the multi-transistor element. For example, it is understood that one multi-transistor element can stand alone. It is also understood that more than two multi-transistor elements can be combined.

Referring now to FIGS. 1-5, the two multi-transistor elements 200 are described. The two multi-transistor elements 200 include a semiconductor substrate 202. The substrate 202 may be or include a semiconductor wafer such as a silicon wafer. The substrate 202 may alternatively or additionally include other elementary semiconductors such as germanium or diamond. The substrate 202 may also include a compound semiconductor such as silicon carbide, gallium arsenic, indium arsenide, or indium phosphide. The substrate 202 may include an alloy semiconductor such as silicon germanium, silicon germanium carbide, gallium arsenic phosphide, and gallium indium phosphide. The substrate 202 may include various p-type doped regions and/or n-type doped regions configured and coupled to form various devices and functional features. In one embodiment, the substrate 202 includes an epitaxial layer overlying a bulk semiconductor. Doping features may be achieved using a process such as ion implantation or diffusion in various steps and techniques. Examples of n-type dopants that may be included in n-type doped regions include phosphorous, nitrogen, arsenic, antimony, and bismuth. Examples of p-type dopants that may be included in p-type doped regions include boron, aluminum, gallium, indium, and thallium. The substrate 202 may include other features such as shallow trench isolation (STI), a semiconductor on insulator (SOI) structure, or combinations thereof.

The two multi-transistor elements 200 include a first multi-transistor element 204a including a source region and drain regions for the first multi-transistor element 204a in the substrate 202. The first multi-transistor element 204a includes a first active area 206a including separated doped regions such as a transistor source region 208, a first element first drain region 210a, and a first element first channel region 216a that may be disposed adjacent the transistor source region 208 and the first element first drain region 210a. The transistor source region 208 and the first element first drain region 210a may be formed by various ion implantation processes. Alternatively, the transistor source region 208 may be portions of an epitaxy layer such as a silicon epitaxy layer formed by epitaxy processing and/or the first element first drain region 210a may be portions of an epitaxy layer such as a silicon epitaxy layer formed by epitaxy processing. In one embodiment, the transistor source region 208 and the first element first drain region 210a are formed by a plurality of processing steps, whether now known or to be developed, such as growing a sacrificial oxide on the substrate 202, opening a pattern for the locations of the transistor source region 208 and the first element first drain region 210a, and implanting the impurities.

The first multi-transistor element 204a also includes a first element second active 218a area similarly including separated doped regions such as the transistor source region 208, a first element second drain region 220a, and a first element second channel region 222a that may be disposed adjacent the transistor source region 208 and the first element second drain region 220a. The first element first active area 206a and the first element second active area 218a may be separated by various isolation features 224a on the substrate 202. An isolation feature 224a such as shallow trench isolation (STI) or local oxidation of silicon (LOCOS) may be disposed on the substrate 202 to define and electrically isolate various active regions. As one example, the formation of an STI feature may include dry etching a trench in a substrate and filling the trench with insulating materials such as silicon oxide, silicon nitride, or silicon oxynitride. The filled trench may have a multilayer structure such as a thermal oxide liner filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride (SIN REMOVE).

A first element first silicide layer may be disposed on the first element first drain region 210a and a first element second silicide layer may be disposed on the first element second drain region 220a. The first element first drain region 210a may be coupled to a first element first bitline 244a and the first element second drain region 220a may be coupled to a first element second bitline 246a. A field oxide region 230 may be disposed on the substrate 202 adjacent the transistor source region 208. The field oxide region 230 may be a dielectric isolation structure and may be formed by a series of steps including: using a patterned mask to expose the transistor source region 208, implanting ions, oxidizing the substrate 202, other suitable processes, and combinations thereof.

An erase gate stack 232 may be disposed on the field oxide region 230, including an erase gate dielectric adjacent the field oxide and an erase gate electrode on the erase gate dielectric. The erase gate dielectric includes a silicon dioxide layer disposed on the field oxide. Alternatively, the erase gate dielectric may include silicon oxide, high dielectric-constant (high k) materials, silicon oxynitride, other suitable materials, or combinations thereof. The high k material may be selected from metal oxides, metal nitrides, metal silicates, transition metal-oxides, transition metal-nitrides, transition metal-silicates, oxynitrides of metals, metal aluminates, zirconium silicate, zirconium aluminate, HfO2, or combinations thereof. The erase gate dielectric may have a multilayer structure such as one layer of silicon oxide and another layer of high k material. The erase gate dielectric may have a thickness ranging between about 20 Angstroms and about 200 Angstroms. The erase gate dielectric may be formed using chemical vapor deposition (CVD), physical vapor deposition (PVD), atomic layer deposition (ALD), thermal oxide, other suitable processes, or combinations thereof.

The erase gate electrode may be designed to be coupled to the metal interconnects and may be disposed overlying the erase gate dielectric. The erase gate electrode includes polycrystalline silicon (or polysilicon). Alternatively, the erase gate electrode may include doped polysilicon, metal such as Al, Cu, W, Ti, Ta, TiN, TaN, NiSi, CoSi, other suitable conductive materials, or combinations thereof. The erase gate electrode may be formed by CVD, PVD, plating, and other proper processes. The erase gate electrode may have a multilayer structure and may be formed in a multiple step process. The erase gate electrode may have a layer of silicide, or any other material suitable to reduce resistance between the erase gate electrode and a contact, disposed thereon.

A first element first floating gate stack may be disposed on the substrate 202. The first element first floating gate stack includes a first element first floating gate 248a, a first element second floating gate 252a, and a first element floating gate isolation dielectric. The first element first floating gate 248a may be disposed adjacent the erase gate stack 232. The first element first floating gate 248a may include polysilicon, doped polysilicon, and combinations thereof. The first element second floating gate 252a may be disposed adjacent the erase gate stack 232 and electrically coupled to the first element first floating gate 248a. The first element first floating gate 248a and the first element second floating gate 252a are coupled on a side adjacent the erase gate stack 232 and separated on a side opposite the erase gate stack 232, defining a first element notch 253a. The first element first floating gate 248a and the first element second floating gate 252a may be created using a processing sequence including oxide growth, chemical vapor deposition (CVD), physical vapor deposition (PVD), atomic layer deposition (ALD), chemical mechanical polishing (CMP), patterning, lithography, photoresist, etching, other suitable processes, and combinations thereof. The first element first floating gate 248a and the first element second floating gate 252a may be self-aligned. There may be no need to separate the first element first floating gate 248a from the first element second floating gate 252a on the side opposite the erase gate stack 232, and therefore there may be no need to use any extra masking steps to separate the first element first floating gate 248a from the first element second floating gate 252a. The coupled first element first floating gate 248a and first element second floating gate 252a may be electrically charged such as, for example, by having electrons transfer charge into and from the coupled first element first floating gate 248a and first element second floating gate 252a through a variety of mechanisms. The presence or absence of this charge represents stored information. The coupled first element first floating gate 248a and first element second floating gate 252a may be surrounded by the first element floating gate isolation dielectric to store the charge. The first element floating gate isolation dielectric may be, for example, silicon dioxide, silicon nitride, and/or multi-dielectric film combinations.

A first element control gate stack 258a may be disposed adjacent the first element first floating gate stack 248a, the first element second floating gate stack 252a, and the erase gate stack 232. The first element control gate stack 258a may include a first element control gate electrode and a first element control gate dielectric. The first element control gate electrode may include polysilicon, doped polysilicon, and combinations thereof. The first element control gate electrode may be surrounded by the first element control gate isolation dielectric. The first element control gate isolation dielectric may be, for example, silicon dioxide, silicon nitride, and/or multi-dielectric film combinations. In an embodiment, between the first element control gate isolation dielectric and the first element first floating gate isolation dielectric may be a first element first inter-poly isolation dielectric. In furtherance of the embodiment, the first element first inter-poly isolation dielectric may be, for example, a layer of silicon dioxide, silicon nitride, and/or multi-dielectric film combinations. In another embodiment, the first element control gate isolation dielectric and the first element first floating gate isolation dielectric may be the same layer. An isolation layer may be provided between a floating gate and a control gate, such as a isolation layer formed on floating gate 248a and located between floating gate 248a and control gate 258a.

The isolation layer may include oxide, silicon nitride, and/or other film known in the art. A capping layer may be present on the control gate including, for example, oxide, silicon nitride, and/or other materials.

A first element wordline gate stack 266a including a first element wordline gate electrode and a first element wordline gate dielectric may be disposed adjacent the first element floating gate stack, the first element control gate stack 258a, the first element first drain region 210a, and the first element second drain region 220a. The first element wordline gate stack 266a may be disposed on the substrate 202, including the first element wordline gate dielectric adjacent the substrate and the first element wordline gate electrode on the first element wordline gate dielectric. The first element wordline gate dielectric includes a silicon dioxide layer disposed on the substrate. Alternatively, the first element wordline gate dielectric may include silicon oxide, high dielectric-constant (high k) materials, silicon oxynitride, other suitable materials, or combinations thereof. The high k material may be selected from metal oxides, metal nitrides, metal silicates, transition metal-oxides, transition metal-nitrides, transition metal-silicates, oxynitrides of metals, metal aluminates, zirconium silicate, zirconium aluminate, HfO2, or combinations thereof. The first element wordline gate dielectric may have a multilayer structure such as one layer of silicon oxide and another layer of high k material. The first element wordline gate dielectric may have a thickness ranging between about 20 Angstroms and about 200 Angstroms. The first element wordline gate dielectric may be formed using chemical vapor deposition (CVD), physical vapor deposition (PVD), atomic layer deposition (ALD), thermal oxide, other suitable processes, or combinations thereof. In an embodiment, a cross-section of a wordline gate stack, such as the wordline gate stack 266a, is of rectangular shape.

The first element wordline gate electrode may be designed to be coupled to metal interconnects and may be disposed overlying the first element wordline gate dielectric. The metal interconnects may include conductive materials such as aluminum, aluminum/silicon/copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Still other manufacturing processes such as thermal annealing may be used to form metal silicide. Alternatively, a copper multilayer interconnect may be used and include copper, copper alloy, titanium, titanium nitride, tantalum, tantalum nitride, tungsten, polysilicon, metal silicide, or combinations. The copper multilayer interconnect may be formed by a technique such as CVD, sputtering, plating, or other suitable processes. The metal silicide used in multilayer interconnects may include nickel silicide, cobalt silicide, tungsten silicide, tantalum silicide, titanium silicide, platinum silicide, erbium silicide, palladium silicide, or combinations thereof.

The first element wordline gate electrode includes polycrystalline silicon (or polysilicon). Alternatively, the first element wordline gate electrode may include doped polysilicon, metal such as Al, Cu, W Ti, Ta, TiN, TaN, NiSi, CoSi, other suitable conductive materials, or combinations thereof. The first element wordline gate electrode may be formed by CVD, PVD, plating, and other proper processes. The first element wordline gate electrode may have a multilayer structure and may be formed in a multiple step process. The first element wordline gate electrode may have a first element wordline silicide layer disposed on a surface of the first element wordline gate electrode.

A second multi-transistor element 204b may be coupled to the first multi-transistor element 204a. The second multi-transistor element 204b includes a source region and drain regions in the substrate 202. The second element 204b includes a first active area 206b including separated doped regions such as the transistor source region 208, a second element first drain region 210b, and a second element first channel region 216b that may be disposed adjacent the transistor source region 208 and the second element first drain region 210b. In an embodiment, the transistor source region 208 may be shared by the first multi-transistor element 204a and the second multi-transistor element 204b. The second element first drain region 210b may be formed by various ion implantation processes. Alternatively, the second element first drain region 210b may be portions of an epitaxy layer such as a silicon epitaxy layer formed by epitaxy processing. In one embodiment, the second element first drain region 210b may be formed by a plurality of processing steps, whether now known or to be developed, such as growing a sacrificial oxide on the substrate 202, opening a pattern for the locations of the second element first drain region 210b, and implanting the impurities. The second multi-transistor element 204b further includes a second element second active 218b area similarly including separated doped regions such as the transistor source region 208, a second element second drain region 220b, and a second element second channel region 222b that may be disposed adjacent the transistor source region 208 and the second element second drain region 220b. The second element first active area 206b and the second element second active area 218b may be separated by various isolation features 224b on the substrate 202.

A second element first silicide layer may be disposed on the second element first drain region 210b and a second element second silicide layer may be disposed on the second element second drain region 220b. The second element first drain region 210b may be coupled to a second element first bitline 244b and the second element second drain region 220b may be coupled to a second element second bitline 246b.

A second element floating gate stack includes a second element first floating gate 248b, a second element second floating gate 252b, and a second element floating gate isolation dielectric. The second element first floating gate 248b may be disposed adjacent the erase gate stack 232. The second element second floating gate 252b may be disposed adjacent the erase gate stack 232 and electrically coupled to the second element first floating gate 248b. The second element first floating gate 248b and the second element second floating gate 252b are coupled on a side adjacent the erase gate stack 232 and separated on a side opposite the erase gate stack 232, defining a second element notch 253b. The second element first floating gate 248b and the second element second floating gate 252b may be created using a processing sequence including chemical vapor deposition (CVD), physical vapor deposition (PVD), atomic layer deposition (ALD), chemical mechanical polishing (CMP), patterning, lithography, photoresist, etching, other suitable processes, and combinations thereof. The second element first floating gate 248b and the second element second floating gate 252b may be self-aligned. There may be no need to separate the second element first floating gate 248b from the second element second floating gate 252b on the side opposite the erase gate stack 232, and therefore there may be no need to use any extra masking steps to separate the second element first floating gate 248b from the second element second floating gate 252b. The coupled second element first floating gate 248b and second element second floating gate 252b may be surrounded by a second element floating gate isolation dielectric to store the charge. The second element floating gate isolation dielectric may be, for example, silicon dioxide.

A second element control gate stack 258b may be disposed adjacent the second element first floating gate stack 248b, the second element second floating gate stack 252b, and the erase gate stack 232. The second element control gate stack 258b may include a second element control gate electrode and a second element control gate dielectric. The second element control gate electrode may be surrounded by a second element control gate isolation dielectric. The second element control gate isolation dielectric may be, for example, silicon dioxide. In an embodiment, between the second element control gate isolation dielectric and the second element first floating gate isolation dielectric may be a second element first inter-poly isolation dielectric. In furtherance of the embodiment, the second element first inter-poly isolation dielectric may be, for example, a layer of SiN. In another embodiment, the second element control gate isolation dielectric and the second element first floating gate isolation dielectric may be the same layer.

A second element wordline gate stack 266b may be disposed adjacent the second element floating gate stack, the second element control gate stack 258b, the second element first drain region 210b, and the second element second drain region 220b. The second element wordline gate stack 266b includes a second element wordline gate electrode and a second element wordline gate dielectric. The second element wordline gate stack 266b may be disposed on the substrate 202, including the second element wordline gate dielectric adjacent the substrate and the second element wordline gate electrode on the second element wordline gate dielectric. The second element wordline gate dielectric includes a silicon dioxide layer disposed on the substrate. Alternatively, the second element wordline gate dielectric may include silicon oxide, high dielectric-constant (high k) materials, silicon oxynitride, other suitable materials, or combinations thereof. The high k material may be selected from metal oxides, metal nitrides, metal silicates, transition metal-oxides, transition metal-nitrides, transition metal-silicates, oxynitrides of metals, metal aluminates, zirconium silicate, zirconium aluminate, HfO2, or combinations thereof. The second element wordline gate dielectric may have a multilayer structure such as one layer of silicon oxide and another layer of high k material. The second element wordline gate dielectric may have a thickness ranging between about 20 Angstroms and about 200 Angstroms. The second element wordline gate dielectric may be formed using chemical vapor deposition (CVD), physical vapor deposition (PVD), atomic layer deposition (ALD), thermal oxide, other suitable processes, or combinations thereof.

The second element wordline gate electrode may be designed to be coupled to metal interconnects and may be disposed overlying the second element wordline gate dielectric. The metal interconnects may include conductive materials such as aluminum, aluminum/silicon/copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Still other manufacturing processes such as thermal annealing may be used to form metal silicide. Alternatively, a copper multilayer interconnect may be used and include copper, copper alloy, titanium, titanium nitride, tantalum, tantalum nitride, tungsten, polysilicon, metal silicide, or combinations. The copper multilayer interconnect may be formed by a technique such as CVD, sputtering, plating, or other suitable processes. The metal silicide used in multilayer interconnects may include nickel silicide, cobalt silicide, tungsten silicide, tantalum silicide, titanium silicide, platinum silicide, erbium silicide, palladium silicide, or combinations thereof.

The second element wordline gate electrode includes polycrystalline silicon (or polysilicon). Alternatively, the second element wordline gate electrode may include doped polysilicon, metal such as Al, Cu, W Ti, Ta, TiN, TaN, NiSi, CoSi, other suitable conductive materials, or combinations thereof. The second element wordline gate electrode may be formed by CVD, PVD, plating, and other proper processes. The second element wordline gate electrode may have a multilayer structure and may be formed in a multiple step process. The second element wordline gate electrode may have a second element wordline silicide layer disposed on a surface of the second element wordline gate electrode.

Figure 6:
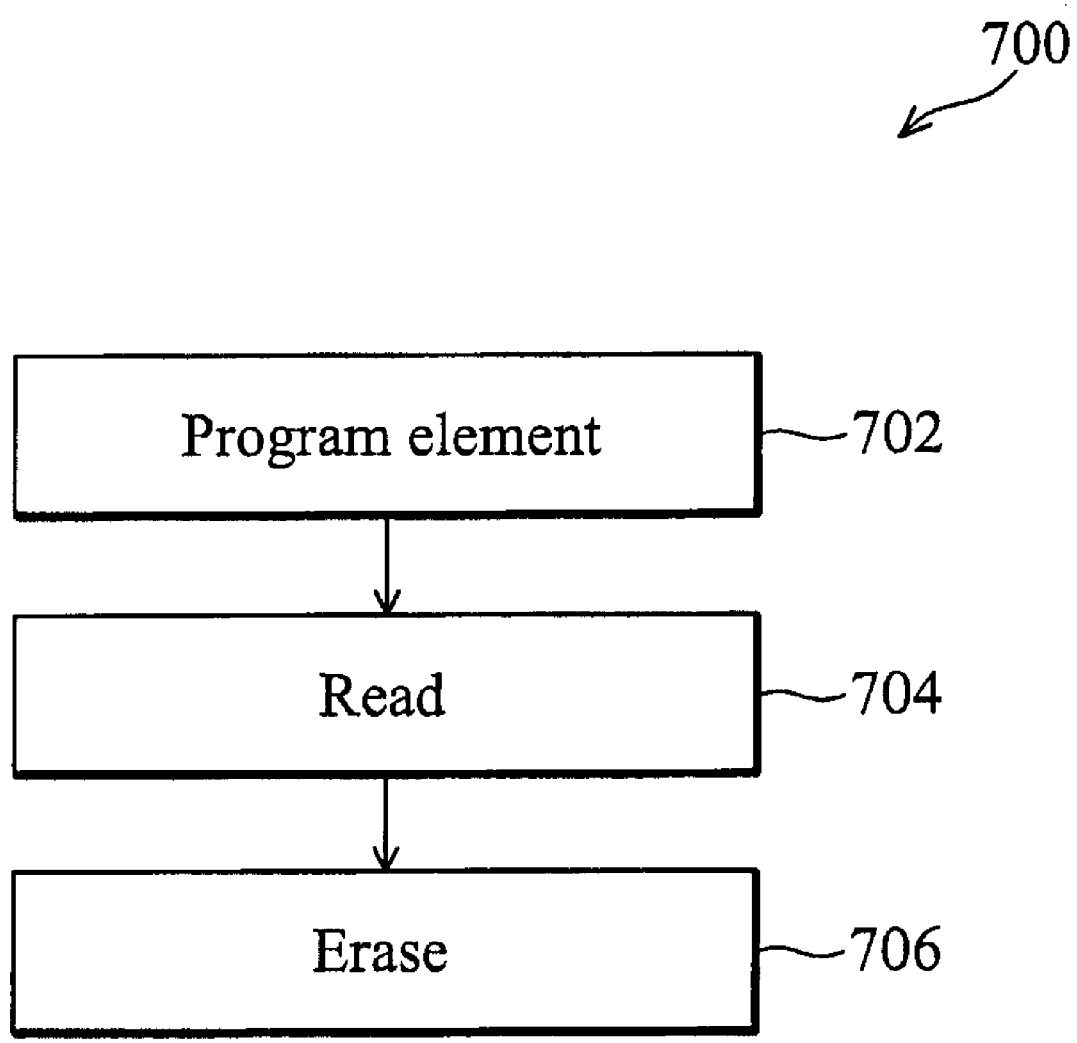
FIG. 6 illustrates a flowchart of an embodiment of a method to operate one of the multi-transistor elements of FIGS. 1-5.
Figure 7:
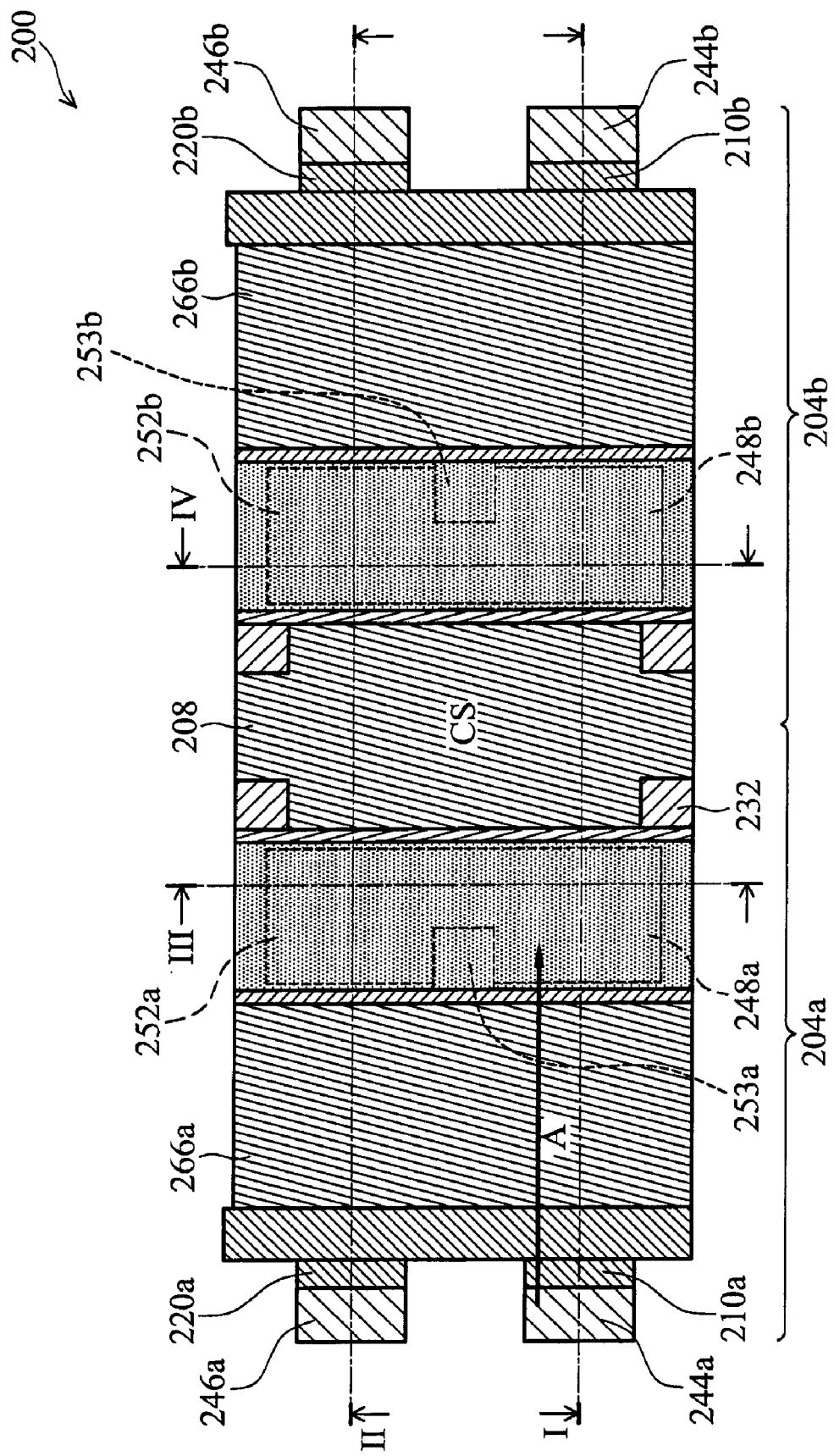
FIGS. 7-12 illustrate various operations of one of the multi-transistor elements of FIGS. 1-5.
Figure 8:
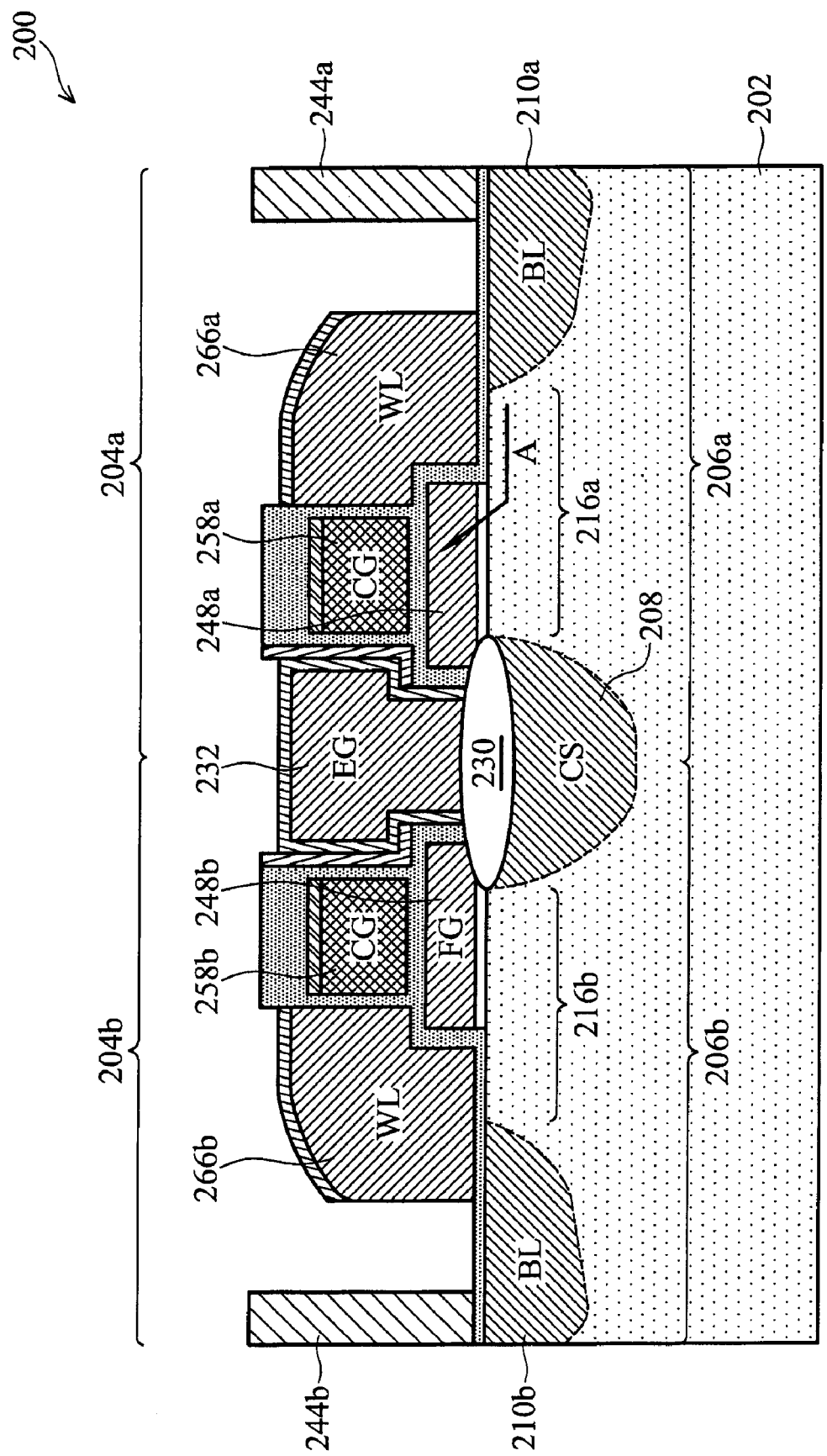
Figure 9:
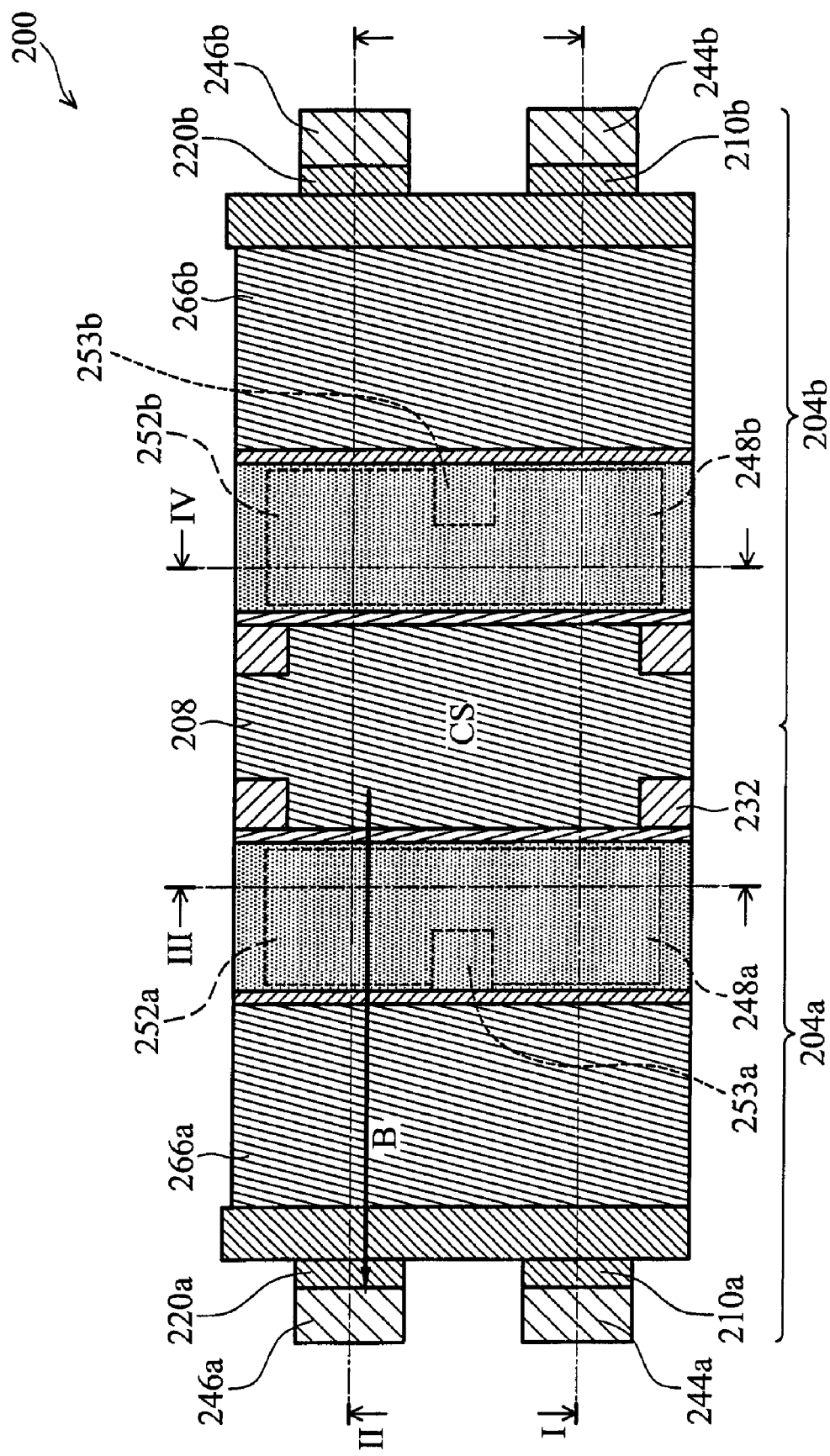
Figure 10:
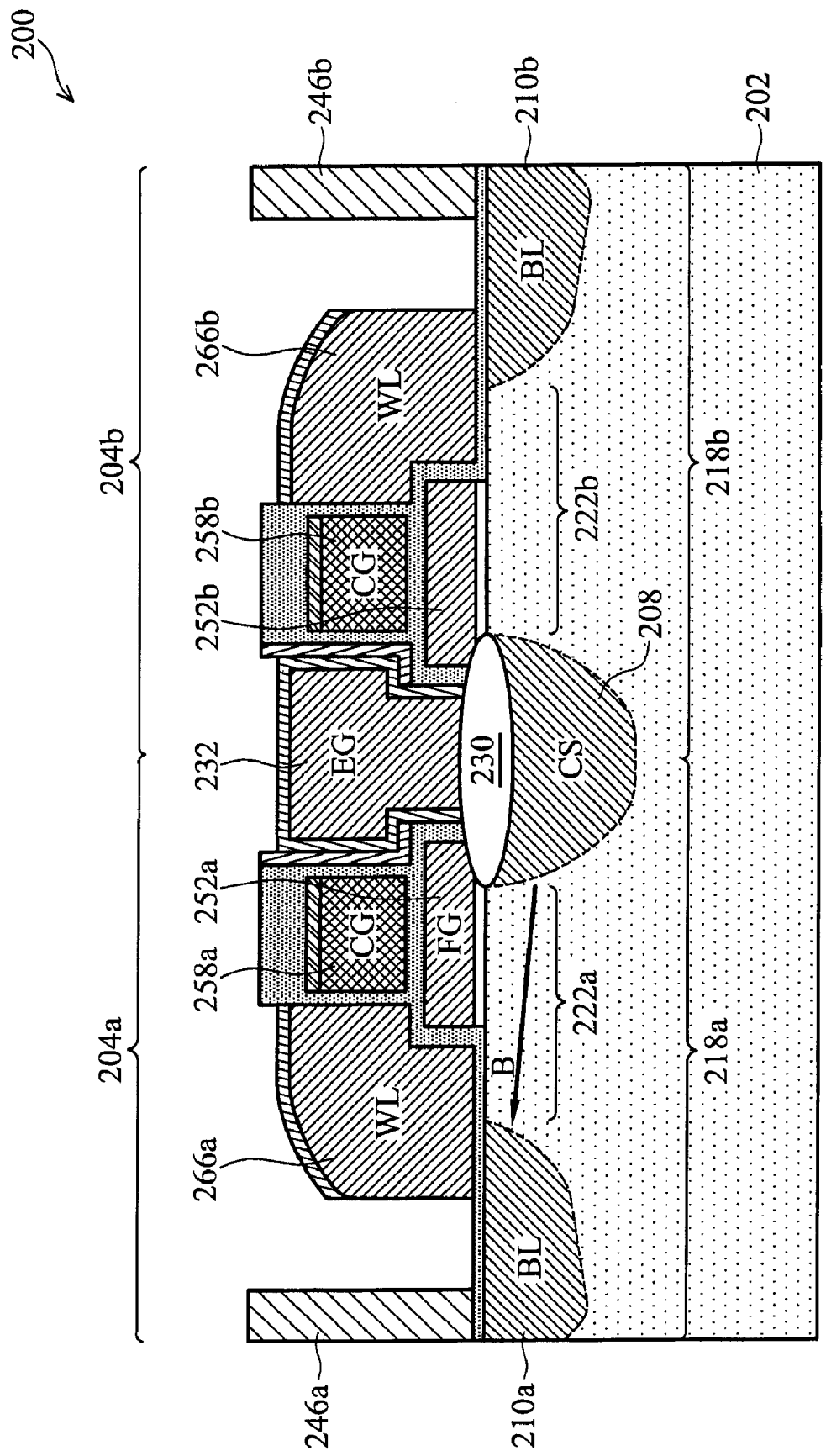
Figure 11:
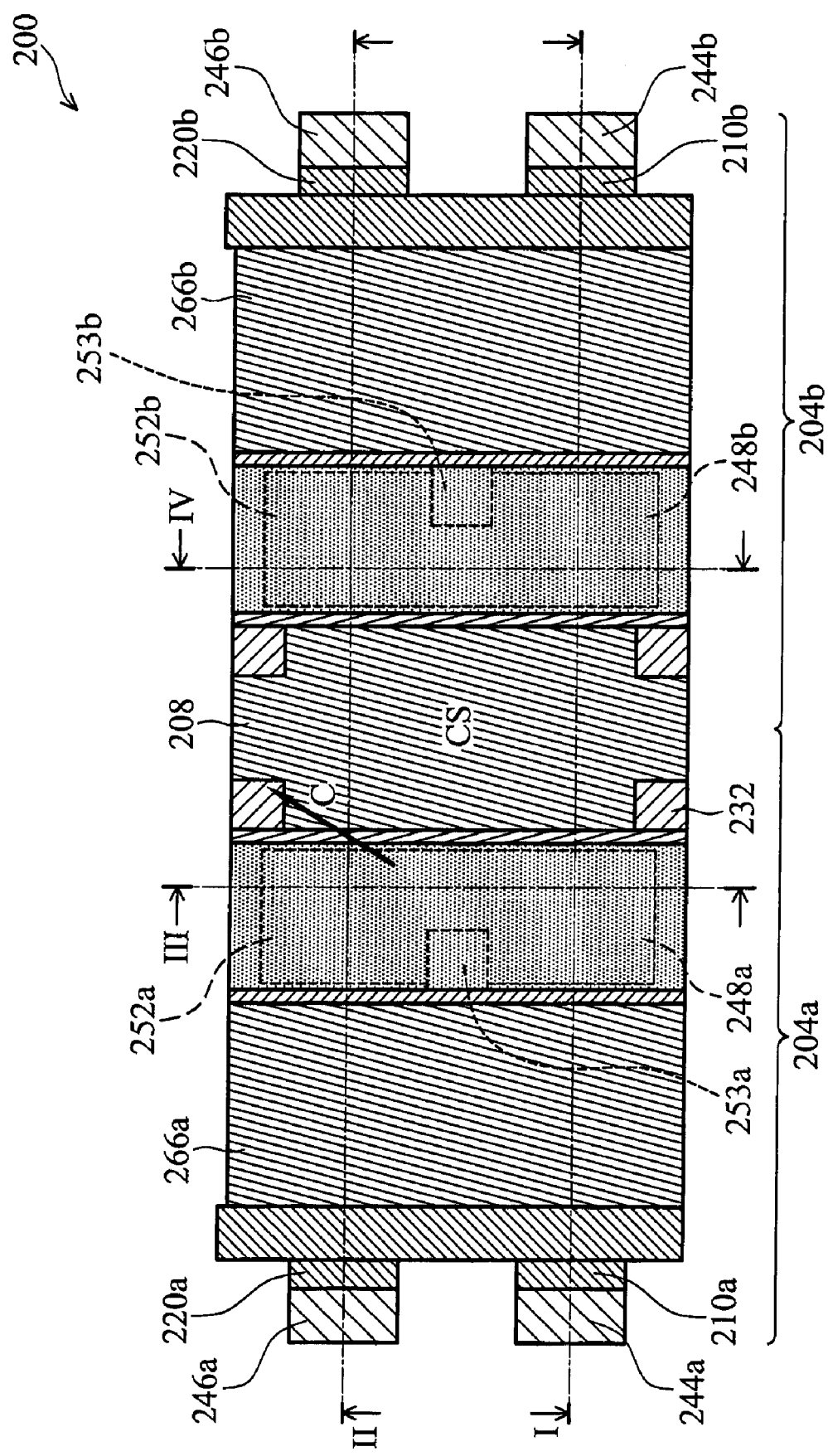
Figure 12:
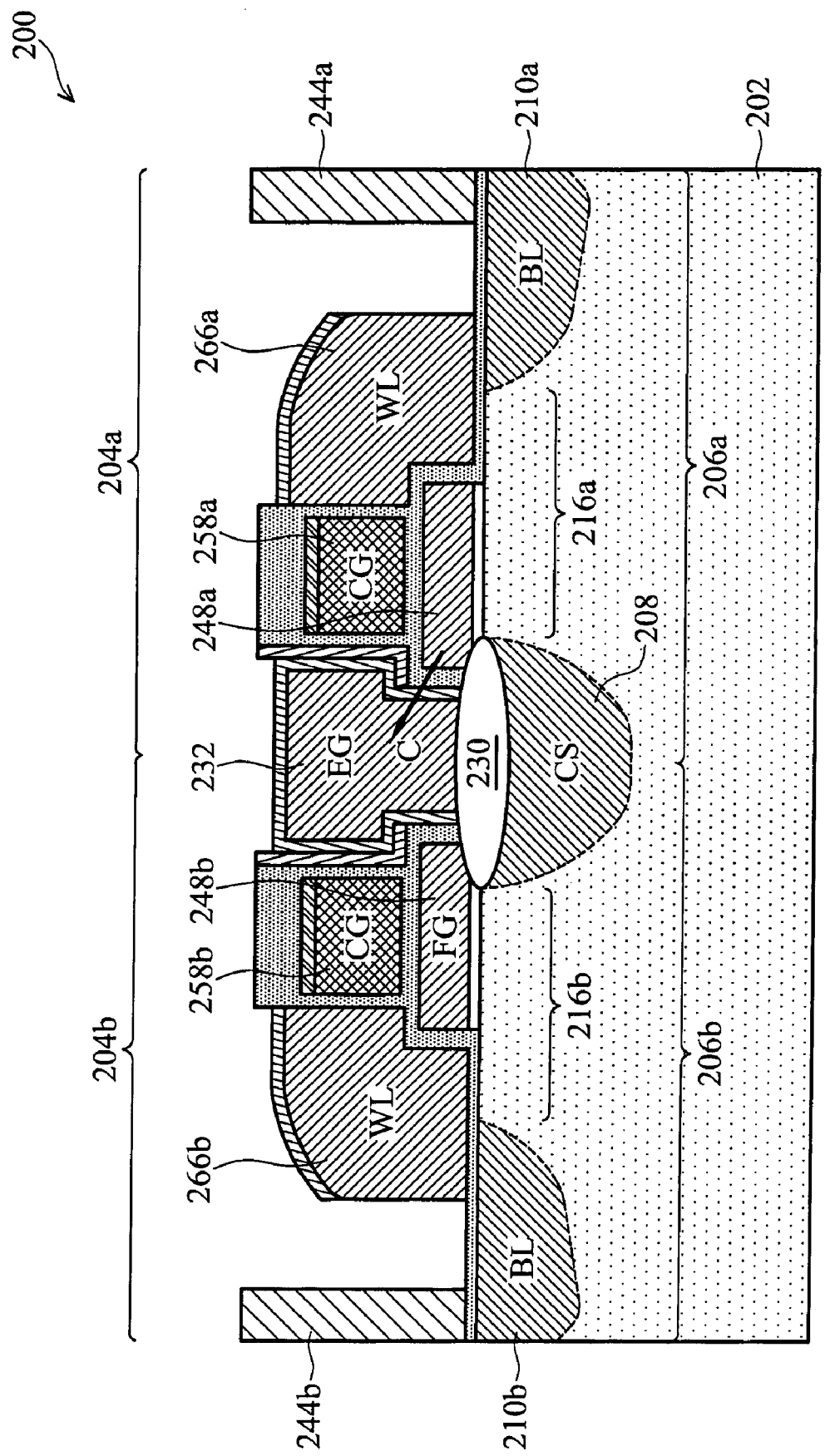

FIG. 6 illustrates a flowchart of one embodiment of a method 700 to operate the first multi-transistor element 204a. FIGS. 7-11 provide various views of the two multi-transistor elements 200 illustrating different operations on the first multi-transistor element 204a. FIGS. 7-8 illustrate programming the first multi-transistor element 204a. FIGS. 9-10 illustrate reading from the first multi-transistor element 204a. FIGS. 11-12 illustrate erasing from the first multi-transistor element 204a. It is understood that additional steps can be provided before, during, and after the method 700, and some of the steps described below can be replaced or eliminated, for additional embodiments of the method 700.

Referring now to FIGS. 6-8, a method 700 for operating the first multi-transistor element 204a is illustrated. The method 700 begins at step 702 where the first element first bitline 244a may be used to program the first multi-transistor element 204a to store data at the first element first floating gate 248a. The first multi-transistor element 204a may be programmed using source side hot electron injection. The first element second bitline 246a may be inhibited while the multi-transistor element may be being programmed. The first element second bitline 246a may be inhibited by being coupled to a voltage that is higher than a voltage level at the first element wordline gate electrode. The first element first bitline 244a may carry between approximately 1 and 10 microamperes. During programming, a voltage level at the first element wordline gate electrode may be between approximately 1 and 2 volts, a voltage level at the first element control gate electrode may be between approximately 10 and 13 volts, and a voltage level at the source region may be between approximately 3 and 6 volts.

Referring now to FIGS. 6 and 9-10, the method 700 then proceeds to step 704 where data stored in the first element first floating gate 248a may be read. The first element first floating gate 248a may be electrically coupled to the first element second floating gate 252a, and therefore the data stored in the first element first floating gate 248a may be read from the first element second floating gate 252a. The data stored in the first element second floating gate 252a may be read using the first element second bitline 246a. While the data may be being read from the first element second floating gate 252a, the first element first bitline 244a may be inhibited. The first element first bitline 244a may be inhibited by being coupled to ground.

Referring now to FIGS. 6 and 11-12, the method 700 then proceeds to step 706 where data stored in the coupled first element first floating gate 248a and first element second floating gate 252a may be erased. Data may be erased by poly-poly Fowler-Nordheim tunneling where the electrons pass through the barrier in the presence of a high electron field. The Fowler-Nordheim tunneling may be achieved by setting a voltage at the erase gate electrode to between approximately 10 and 13 volts and setting the first element wordline gate electrode to ground and the first element control gate electrode to ground or negative bias.

Figure 13:
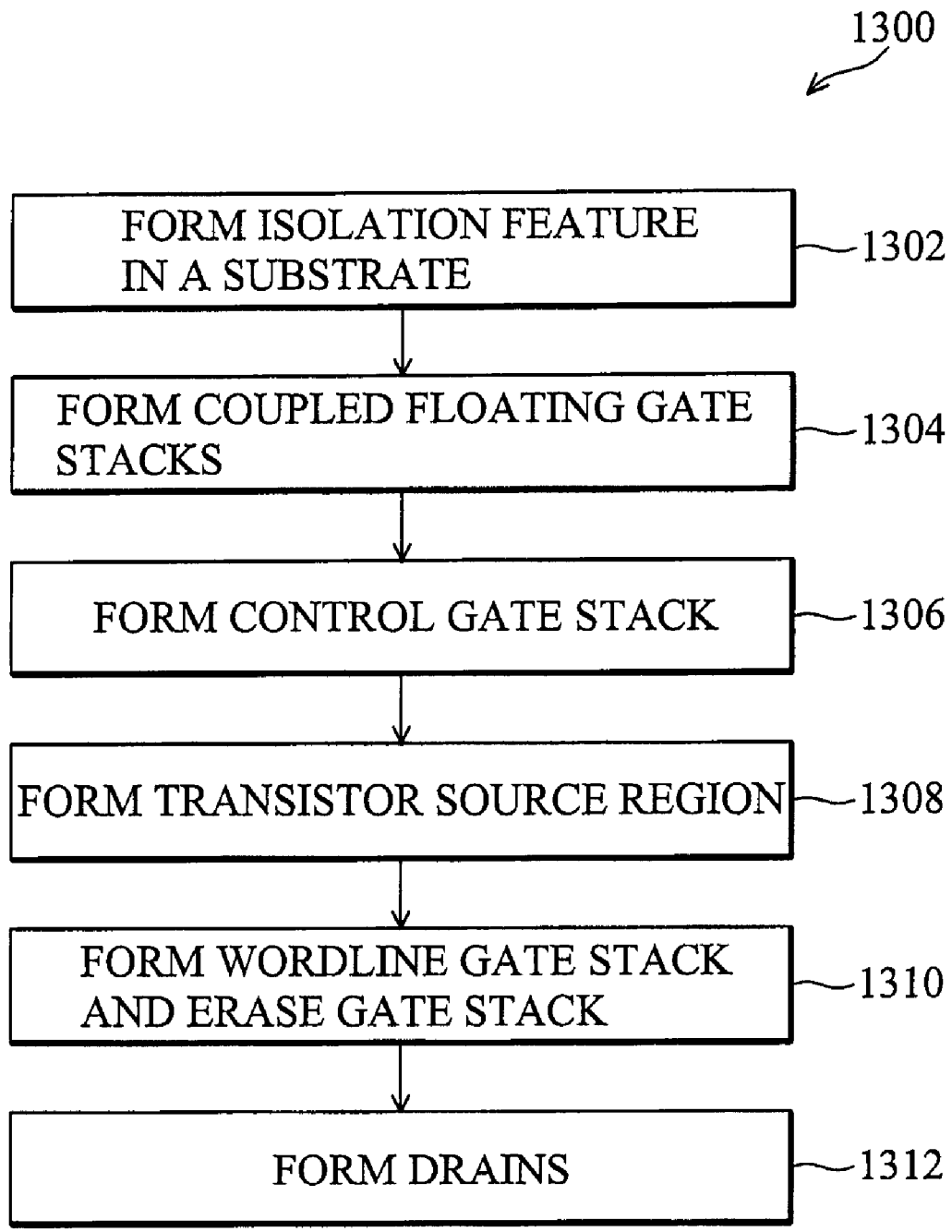
FIG. 13 illustrates a flow chart of an embodiment of a method to manufacture one of the multi-transistor elements of FIGS. 1-5.

FIG. 13 illustrates a flow chart of an embodiment of a method 1300 to manufacture one of the multi-transistor elements of FIGS. 1-5. It is understood that additional steps can be provided before, during, and after the method 1300, and some of the steps described below can be replaced or eliminated, for additional embodiments of the method 1300.

Referring now to FIGS. 1-5 and 13, a method 1300 for manufacturing the first multi-transistor element 204a is illustrated. The method 1300 begins at step 1302 where the isolation feature 224a is formed in the substrate 202. The method 1300 then proceeds to step 1304 where the first element first floating gate stack and the first element second floating gate stack are formed on the substrate 202. The first element floating gate stack and the first element second floating gate stack are coupled. The method 1300 then proceed to step 1306 where the first element control gate stack 258a is formed adjacent the first element first floating gate stack and the first element second floating gate stack. The method 1300 then proceeds to step 1308 where the transistor source region 208 is formed in the substrate 202 adjacent the first element floating gate stack and the first element second floating gate stack. The method 1300 then proceeds to step 1310 where the first element wordline gate stack 266a and the erase gate stack 232 are formed. The first element wordline gate stack is formed adjacent the first element floating gate stack and the first element control gate stack 258a. The erase gate stack 232 is formed adjacent the first element floating gate stack and the first element second floating gate stack. The method 1300 then proceeds to step 1312 where the first element first drain region 210a and the first element second drain region 220 are formed in the substrate 202. The first element first drain region 210a is formed adjacent the first element first floating gate stack, and the first element second drain region 220 is formed adjacent the first element second floating gate stack.

Figure 14:
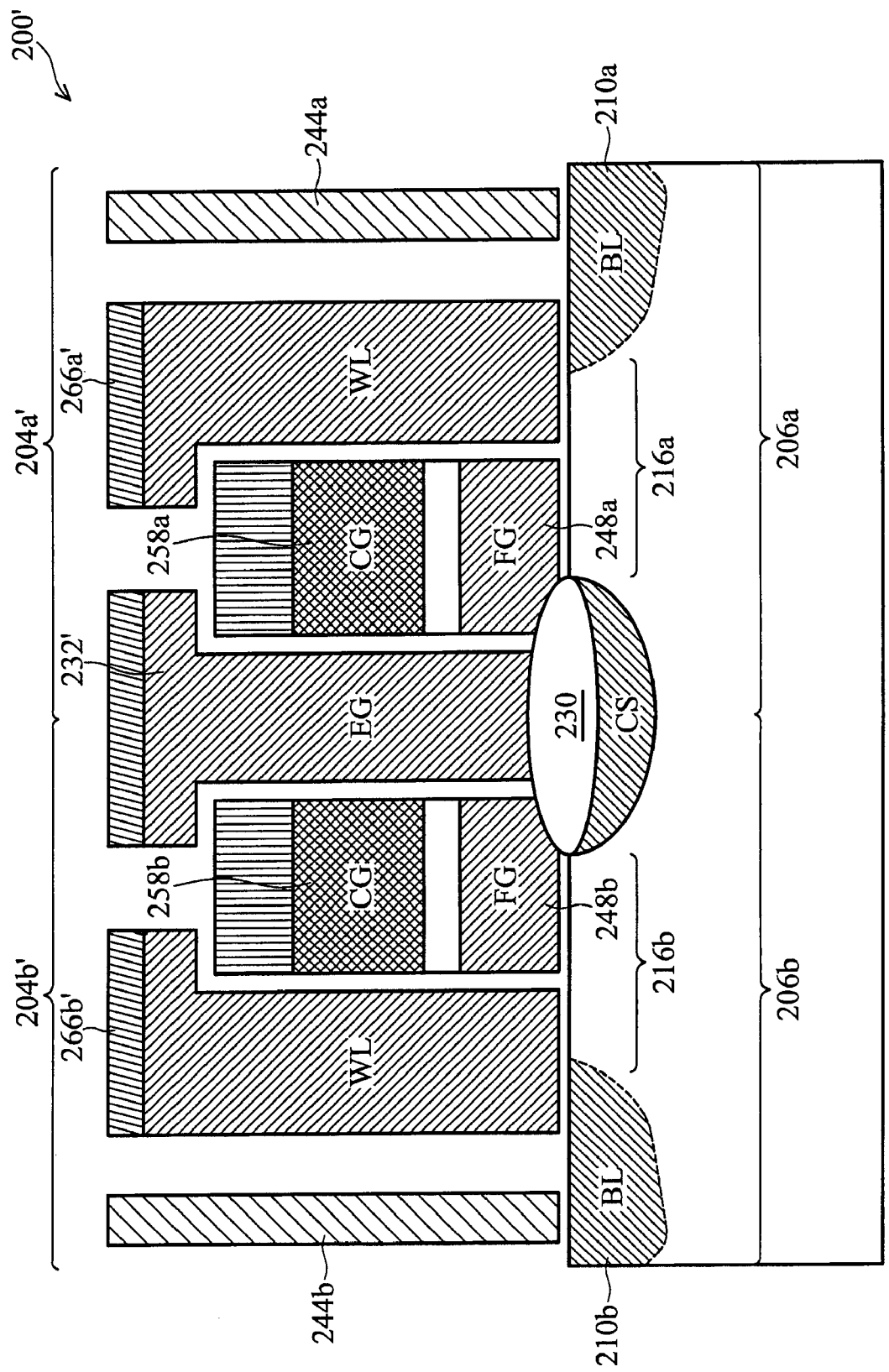
FIG. 14 illustrates an embodiment of two further multi-transistor elements.

FIG. 14 illustrates a cross-sectional view of an embodiment of two further multi-transistor elements 200'. The two further multi-transistor elements 200' may be similar to the two multi-transistor elements 200, described above with reference to FIGS. 1-5, except where indicated otherwise. The two further multi-transistor elements 200' include a first multi-transistor element 204a' and a second multi-transistor element 204b'. The first multi-transistor element 204a', which may be similar to the first multi-transistor element 204a of FIGS. 1-5, includes a first element wordline gate stack 266a'. The second multi-transistor element 204b', which may be similar to the second multi-transistor element 204b of FIGS. 1-5, includes a second element wordline gate stack 266b'. The two further multi-transistor elements 200' additionally include an erase gate stack 232'. As can be seen in FIG. 14, each of the first element wordline gate stack 266a' and the erase gate 232' includes a top portion that extends horizontally over at least a portion of the first element control gate stack 258a. Similarly, each of the second element wordline gate stack 266b' and the erase gate 232' includes a top portion that extends horizontally over at least a portion of the second element control gate stack 258b.

Thus, the present disclosure provides a multi-transistor element. In one embodiment, the multi-transistor element includes a substrate. A first floating gate may be disposed on the substrate. A second floating gate may be disposed on the substrate and coupled to the first floating gate. A first active region may be disposed in the substrate and coupled to the first and second floating gates.

The present disclosure also provides a method for operating a multi-transistor element. In one embodiment, the method includes programming using a program-bitline, wherein during the programming a read-bitline corresponding to the program bitline may be inhibited.

The present disclosure also provides a method for manufacturing a multi-transistor element. In one embodiment, the method includes forming a shallow trench isolation structure in a substrate, and forming two coupled floating gate stacks adjacent the shallow trench isolation structure, wherein the two coupled floating gate stacks remain coupled.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A system comprising:
   a substrate;
   a first active region and a second active region disposed in the substrate;
   a first and second multi-transistor element disposed on the substrate, the first and second multi-transistor elements each including:
      an isolation feature;
      a floating gate stack adjacent to the isolation feature, the floating gate stack including a first region, a second region, and a notch interposing the first and second regions;
      a control gate stack adjacent to the floating gate stack;
      a first bitline coupled to the first region of the floating gate stack;
      a second bitline coupled to the second region of the floating gate stack; and
      a wordline adjacent to the floating gate stack and the control gate stack;
   an erase gate disposed on the substrate and coupled to the first and second multi-transistor elements; and
   a common source coupled to the first and second multi-transistor elements,
   wherein the first multi-transistor element is coupled to the first active region and the second multi-transistor element is coupled to the second active region, and
   wherein the first and second multi-transistor elements are disposed such that the notch of their respective floating gate stacks open in opposite directions.

2. The system of claim 1, wherein the first bitline is a read bitline and the second bitline is a program bitline, and
   wherein the read bitline is configured to be inhibited when the program bitline is in use.

3. The system of claim 1, wherein the first and second multi-transistor elements further include:

a first drain adjacent the wordline gate stack; and a second drain adjacent the wordline gate stack.

4. The system claim 3, wherein the first drain is coupled to the first bitline;

and the second drain is coupled to the second bitline.

5. The system of claim 1, wherein the floating gate stack includes a material selected from the group consisting of: polysilicon, doped polysilicon, and a combination of polysilicon and doped polysilicon.

6. The system of claim 1, wherein the first and second regions of the floating gate stack of the first and second multi-transistor elements are physically coupled.

* * * * *